US012751225B2

(12) United States Patent
Sherpa et al.

(10) Patent No.: US 12,751,225 B2
(45) Date of Patent: Sep. 29, 2026

(54) ETCHING SUBSTRATES USING VAPOR ADSORPTION

(71) Applicant: Applied Materials, Inc., Santa Clara, CA (US)

(72) Inventors: Sonam Dorje Sherpa, San Ramon, CA (US); Alok Ranjan, San Ramon, CA (US); Geuntak Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 250 days.

(21) Appl. No.: 18/539,892

(22) Filed: Dec. 14, 2023

(65) Prior Publication Data

US 2025/0201569 A1 Jun. 19, 2025

(51) Int. Cl.
*H10P 50/24* (2026.01)

(52) U.S. Cl.
CPC .................................. *H10P 50/242* (2026.01)

(58) Field of Classification Search
None
See application file for complete search history.

(56) References Cited

U.S. PATENT DOCUMENTS

| | | | | |
|---|---|---|---|---|
| 2015/0037972 | A1 | 2/2015 | Danek et al. | |
| 2016/0293432 | A1 | 10/2016 | Ranjan et al. | |
| 2017/0186621 | A1 | 6/2017 | Zaitsu | |
| 2019/0027373 | A1 | 1/2019 | Kwon et al. | |
| 2020/0381264 | A1* | 12/2020 | Yatsuda | H01L 21/3065 |
| 2022/0165578 | A1* | 5/2022 | Tomura | H01J 37/32082 |
| 2022/0199418 | A1* | 6/2022 | Zhang | H01L 21/0212 |

OTHER PUBLICATIONS

International Search Report and Written Opinion for International Application No. PCT/US2024/059863, mailed Apr. 8, 2025, 10 Pages.

* cited by examiner

*Primary Examiner* — Stephanie P Duclair
(74) *Attorney, Agent, or Firm* — Lowenstein Sandler LLP

(57) ABSTRACT

A method includes obtaining a substrate, and etching a portion of the substrate using an etch process performed at a temperature of less than or equal to about zero degrees Celsius. Etching the portion of the substrate includes forming an etchant on the substrate using vapor adsorption.

20 Claims, 6 Drawing Sheets

ETCHING SUBSTRATES USING VAPOR ADSORPTION

TECHNICAL FIELD

Embodiments of the present disclosure generally relate to electronic device fabrication. Particularly, embodiments of the present disclosure relate to an etch process that mitigates etch byproduct formation.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes. For many processes gases are flowed into the process chamber. Electronic devices such as semiconductor devices are manufactured by performing a series of operations that may include deposition, oxidation, photolithography, ion implantation, etch, and so on to form many patterned layers. For example, an electronic device can include dielectric layers formed from a dielectric material, conductive layers formed from a conductive material, and semiconductor layers formed from a semiconductor material. Electronic device processing techniques can involve performing patterning (e.g., photolithography) to create device structures. For example, patterning can include multiple and repetitive processes of deposition and etching.

SUMMARY

In accordance with an embodiment, a method is provided. The method includes obtaining a substrate, and etching a portion of the substrate using an etch process performed at a temperature of less than or equal to about zero degrees Celsius. Etching the portion of the substrate includes forming an etchant on the substrate using vapor adsorption.

In accordance with another embodiment, a method is provided. The method includes forming, on a substrate at a temperature of less than or equal to about zero degrees Celsius via physisorption, an adsorbed layer comprising molecules of an etchant gas, and initiating ion-impact dissociation of adsorbed species or ion-impact desorption of a non-volatile reaction layer of the adsorbed layer to remove the portion of the substrate.

In accordance with yet another embodiment, a method is provided. The method includes forming, on a substrate at a temperature of less than or equation to about zero degrees Celsius via physisorption of molecules of an etchant gas, a non-volatile reaction layer based on a native oxide formed on the substrate, initiating ion-impact desorption of the non-volatile reactive layer to remove the portion of the substrate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
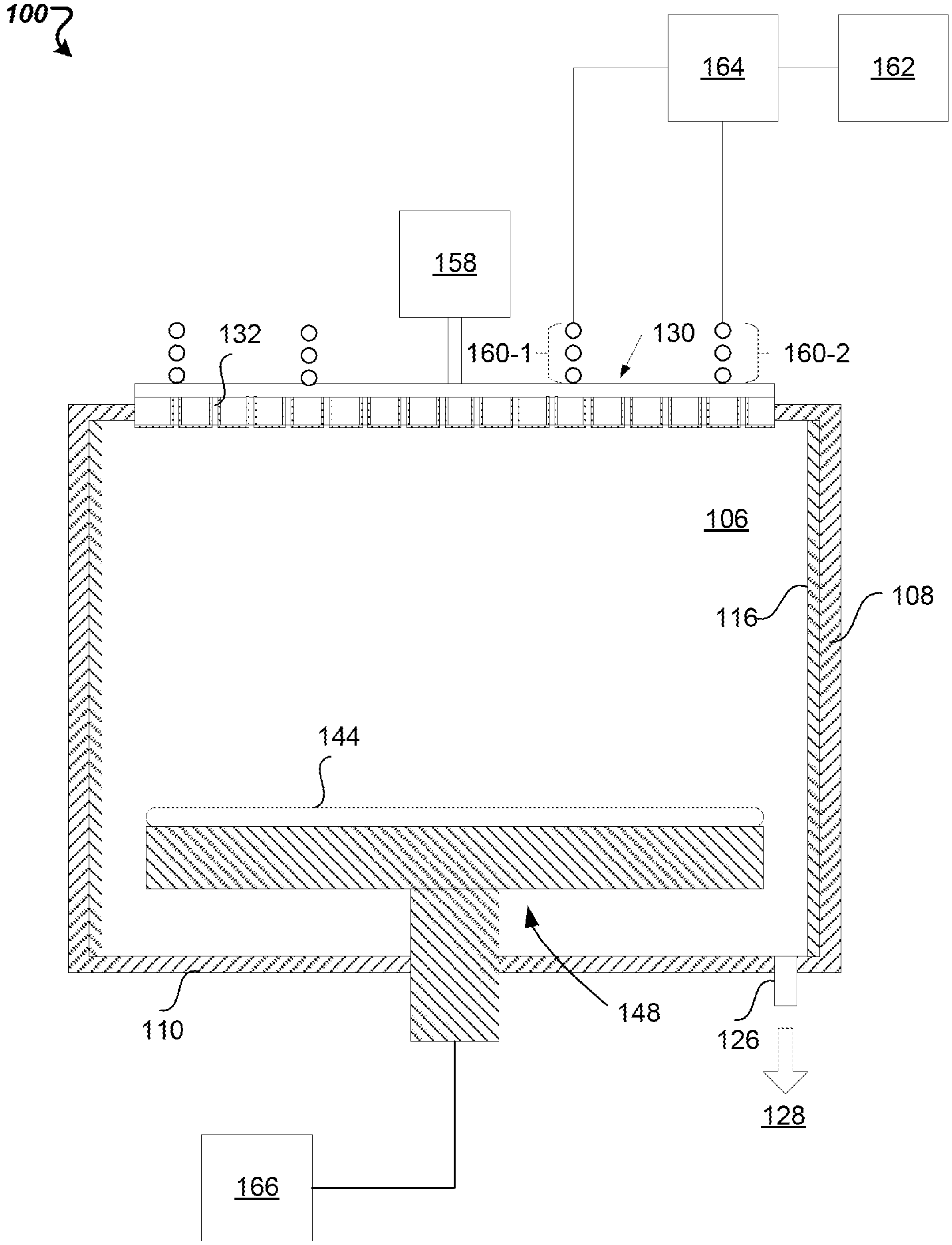
FIG. 1 a cross-sectional view of a processing chamber, in accordance with some embodiments.

Embodiments described herein relate to etching substrates using vapor adsorption at temperatures below or around zero degrees Celsius (0° C.). Moreover, embodiments herein relate to etching substrates using a byproduct-free etch process or an etch process that is close to free of etch byproducts. Generally, etching refers to a process for removing material from a base structure including a substrate or one or more layers formed on a substrate. One example of etching is dry etching. Examples of dry etching include gas-phase etching and plasma-phase etching. Gas-phase etching removes material from the substrate using gas.

Plasma-phase ("plasma") etching removes material using plasma. Examples of plasma etching include isotropic plasma etching, ion beam milling or sputter etching, reactive-ion etching (RIE), etc. Plasma can be generated from a process gas. The plasma can include reactive species such as charged particles (e.g., ions) and/or neutral particles (e.g., atoms and/or radicals). The surface of the at least one exposed region of the substrate reacts with the plasma, which results in the etching of the exposed portions of the substrate. The type of process gas within the gas mixture is dependent on the material of the substrate to be etched. The reactions between the substrate (or one or more layers on the substrate) and the reactive species can generate volatile etch byproducts (e.g., smaller molecules), which can be removed by a vacuum system. In some implementations, the process gas is delivered within a gas mixture that further includes a carrier gas. More specifically, the carrier gas can be an inert gas. For example, a carrier gas can be a noble gas, such as helium (He), argon (Ar), neon (Ne), xenon (Xe), krypton (Kr), radon (Rn), etc. In some implementations, the gas mixture can include a mixture of carrier gases. The carrier gas (or carrier gas mixture) can be used to dilute the gas mixture to control etch rate or improve etch performance. In some implementations, the process gas is delivered without a carrier gas. For example, the process gas can be delivered via heated gas lines.

After a dry etch pulse or cycle, etch byproducts or residue can form on the sidewalls of an etch mask and/or of the sidewalls of features within the substrate. More specifically, the etch products can form within openings formed between features. An opening can be formed in at least a top surface of the substrate and/or in the bottom surface of the substrate. In some embodiments, an opening is a via hole. The etch byproducts can form at least in part due to sputtering of a mask material (e.g., silicon (Si)). For example, the etch byproducts can include a silicon oxide material (e.g., $SiO_2$). More specifically, during a bias power off time during the dry etching, the sputtered material can recombine on the surface of the sidewalls of the etch mask and/or substrate.

In the case of an opening and/or feature with sufficiently small widths (e.g., critical dimensions), etch byproducts can cause blockage or clogging of the opening after an etch cycle. For example, etch byproducts can cause clogging of an opening having a critical dimension of less than or equal to about 10 nanometers (nm). The clogging can prevent additional dry etch processes (e.g., pulses/cycles) from being performed, and can reduce the accessibility of corners of high aspect ratio features, which can result in a tapered profile. Aspect ratio refers to the ratio of the height of a feature to the width of the feature (e.g., critical dimension). A feature can have any suitable aspect ratio in accordance with embodiments described herein. In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nanometers (nm) and the width of the feature can be about 16 nm (e.g., an aspect ratio of about 62.5:1).

In some implementations, etch byproducts can be removed by performing a cleaning process after each etch pulse, also referred to as a "flash" process. The etch pulse and the flash process can alternatively repeat until sufficient material is removed from the substrate (e.g., the features reach a target height). One approach to eliminating byproduct redeposition includes a cyclic etch of the substrate that proceed with chemisorption of a halogen, such as chlorine (CI). However, chemisorption can be limited to one or two monolayers, so the etch rate per cycle can be limited (e.g., a few Angstroms per cycle).

To address these and other drawbacks, embodiments described herein can be used to etch substrates using vapor adsorption to mitigate etch byproduct formation. More specifically, an etch process described herein can be used to reduce or eliminate etch byproducts that may be generated using other etch processes. At a suitable temperature, the molecules of a etchant gas adsorb to a surface of a substrate to form an adsorbed layer. In some embodiments, the substrate includes a silicon (Si) substrate and the etchant gas includes at least one fluorine (F)-containing gas. Examples of F-containing gases include fluorine ($F_2$), hydrogen fluoride (HF), xenon difluoride ($XeF_2$), chlorine trifluoride ($ClF_3$), bromine trifluoride ($BrF_3$), bromine pentafluoride ($BrF_5$), iodine pentafluoride ($IF_5$), etc. In some embodiments, the substrate includes one or more silicon or silicon-containing layers thereon that are to be etched, such as a silicon mask. In some embodiments, the temperature at which the etch process is performed is less than or equal to 0° C. (i.e., a sub-zero degree temperature). For example, the etch process can be performed at a temperature of less than about 0° C. As another example, the etch process can be performed at a temperature of less than or equal to about −10° C. As another example, the etch process can be performed at a temperature of less than or equal to about −20° C. As another example, the etch process can be performed at a temperature of less than or equal to about −30° C. As yet another example, the etch process can be performed at a temperature of less than or equal to about −40° C. As yet another example, the etch process can be performed at a temperature of less than or equal to about −50° C. As yet another example, the etch process be performed at a temperature of less than or equal to about −60° C. As yet another example, the etch process can be performed at a temperature of less than or equal to about −70° C. As yet another example, the etch process can be performed at a temperature of less than or equal to about −80° C. As yet another example, the etch process can be performed at a temperature of less than or equal to about −90° C.

In some embodiments, the etch process is a single-step etch process in which the adsorbed layer spontaneously etches the substrate at the suitable temperature. For example, the etchant gas undergoes dissociative adsorption into respective atoms, which release radicals that can etch the substrate. Further details regarding these embodiments will be described below with reference to FIGS. 2 and 6A.

In some embodiments, the etch process is a first multi-step etch process. For example, the first multi-step etch process can include a first step to form the adsorbed layer, similar to the process above. The first multi-step etch process can further include a second step in which ion-dissociation of the adsorbed layer is performed to release neutral particles ("neutrals") on the surface of the substrate (or one or more layers on the substrate). A neutral is a species that does not have any electric charge (e.g., radical). The ion-impact dissociation can be performed by bombarding the surface of the substrate with ions. The ion bombardment can cause the molecules of the adsorbed layer to break into respective atoms that can etch the substrate. Performing ion-impact dissociation can include generating a plasma using any suitable gas. In some embodiments, the plasma is generated using an inert gas. For example, the plasma can be generated using Ar. In some embodiments, the plasma is generated using an ion energy greater than or equal to about 25 electron-volts (eV). In some embodiments, each step of the multi-step etch process is performed at a sub-zero degree temperature. Further details regarding these embodiments will be described below with reference to FIGS. 3 and 6B.

In some embodiments, the etch process is a second multi-step etch process that may be performed to break through a native oxide formed on a substrate (or one or more layers on the substrate). For example, the second multi-step etch process can include a first step to form a non-volatile reactive layer on a surface of a substrate (or on one or more layers on the substrate). More specifically, the molecules of the gas introduced in the processing chamber, as described above, can adsorb onto a native oxide formed on the substrate. In some embodiments, the substrate (or an upper layer on the substrate is Si, and a native oxide includes silicon dioxide ($SiO_2$) formed on the substrate or on the upper layer of the substrate. The second multi-step etch process can further include a second step in which ion-impact desorption of the non-volatile reactive layer is performed to release neutrals on the surface of the substrate. The ion-impact desorption can be performed by bombarding the surface of the substrate with ions. The ion bombardment can cause the desorption of the non-volatile reaction layer, which etches the substrate. Performing ion-impact desorption can include generating a plasma using any suitable gas. In some embodiments, the plasma is generated using an inert gas. For example, the plasma can be generated using Ar. In some embodiments, the plasma is generated using an ion energy greater than or equal to about 25 eV. In some embodiments, each step of the multi-step etch process is performed at a sub-zero degree temperature. Further details regarding these embodiments will be described below with reference to FIGS. 4 and 6C.

FIG. 1 is a cross-sectional view of a processing chamber 100, in accordance with some embodiments. For example, the processing chamber 100 can be used for etch processes in which a corrosive plasma environment and/or corrosive chemistry is provided. For example, the processing chamber 100 may be a chamber for a plasma etch reactor (also known as a plasma etcher). Examples of chamber components that may be exposed to plasma in the processing chamber 100 are a substrate support assembly 148, an electrostatic chuck (ESC), a ring (e.g., a process kit ring or single ring), a chamber wall, a base, a showerhead 130, a gas distribution plate, a liner, a liner kit, a shield, a plasma screen, a flow equalizer, a cooling base, a chamber viewport, a chamber lid, a nozzle, process kit rings, and so on.

In one embodiment, the processing chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The processing chamber body 102 may be fabricated from aluminum, stainless steel or other suitable material. The processing chamber body 102 generally includes sidewalls 108 and a bottom 110. Any of the showerhead 130 (or lid and/or nozzle), sidewalls 108 and/or bottom 110 may include the multi-layer plasma resistant coating.

An outer liner 116 may be disposed adjacent the sidewalls 108 to protect the processing chamber body 102. The outer liner 116 may be a halogen-containing-gas resist material such as $Al_2O_3$ or $Y_2O_3$. The outer liner 116 may be coated with the multi-layer plasma resistant ceramic coating in some embodiments.

An exhaust port 126 may be defined in the processing chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewalls 108 of the processing chamber body 102 and/or on a top portion of the processing chamber body. The showerhead 130 (or lid) may be opened to allow access to the interior volume 106 of the processing chamber 100, and may provide a seal for the processing chamber 100 while closed. A gas panel 158 may be coupled to the processing chamber 100 to provide a gas mixture including at least one process gas and/or at least one carrier gas to the interior volume 106 through the showerhead 130 or lid and nozzle. Examples of process gas that may be delivered by the gas panel 158 and used to process substrates/samples in the processing chamber 100 include fluorine ($F_2$), hydrogen fluoride (HF), xenon fluoride ($XeF_2$), chlorine trifluoride ($ClF_3$), bromine trifluoride ($BrF_3$), bromine pentafluoride ($BrF_5$), iodine pentafluoride ($IF_5$), hydrogen bromide (HBr), nitrogen trifluoride ($NF_3$), etc. Examples of carrier gases (e.g., diluents) include inert gases (e.g., noble gases). The showerhead 130 includes multiple gas delivery holes 132 throughout the showerhead 130. The showerhead 130 may be or may include aluminum, anodized aluminum, an aluminum alloy (e.g., Al 6061), or an anodized aluminum alloy. In some embodiments, the showerhead 130 includes a gas distribution plate bonded to the showerhead. The gas distribution plate may be, for example, Si or SiC. The gas distribution plate may additionally include multiple holes that line up with the holes in the showerhead 130.

In some embodiments, plasma is capacitively coupled plasma (CCP) generated by capacitively coupling power to the processing chamber 100. In some embodiments, plasma is inductively coupled plasma (ICP) generated by inductively coupling power to the processing chamber 100. For example, in some embodiments, inductive coils including inductive coils 160-1 and 160-2 are located above the showerhead 130. Inductive coils 160-1 and 160-2 can be powered by a power supply 162 coupled to match circuitry 164. In some embodiments, the power supply 162 includes a radio frequency (RF) generator. In some embodiments, the power supply 162 includes a pulsed direct current (DC) power supply.

A substrate support assembly 148 is disposed in the interior volume 106 of the processing chamber 100 below the showerhead 130. The substrate support assembly 148 holds a substrate 144 including a substrate during processing. The substrate may be a bare silicon substrate, may be a substrate having one or more layers formed thereon, may be a patterned substrate having one or more patterned features formed thereon, may include a mask (e.g., a mask having regions that have been cured via photolithography), and so on. The substrate support assembly 148 may include an electrostatic chuck that secures the substrate 144 during processing, a metal cooling plate bonded to the electrostatic chuck, and/or one or more additional components. An inner liner may cover a periphery of the substrate support assembly 148. The inner liner may be a halogen-containing-gas resist material such as $Al_2O_3$ or $Y_2O_3$. The substrate support assembly 148, portions of the substrate support assembly 148, and/or the inner liner may be coated with the metal layer and barrier layer in some embodiments.

In some embodiments, the substrate support assembly 148 is biased to produce a plasma in the processing chamber 100. For example, the substrate support assembly 148 can be biased by using a power supply 166. In some embodiment, the power supply 166 includes an RF generator. In some embodiments, the power supply includes a pulsed DC power supply.

The processing chamber 100 may be configured to etch the substrate 144 using vapor adsorption to minimize etch product formation. More specifically, a etch process can be performed to etch a substrate of the substrate 144. In some embodiments, the substrate 144 includes a Si substrate. In some embodiments, a native oxide is formed on the substrate 144. For example, the native oxide can include $SiO_2$. In some embodiments, the etch process is performed at a sub-zero degree temperature. In some embodiments, the etch process is a single-step etch process. In some embodiments, the etch process is a multi-step etch process. Further details regarding etching the substrate 144 using vapor adsorption to minimize etch product formation will now be described below with reference to FIGS. 2-6C.

Figure 2:
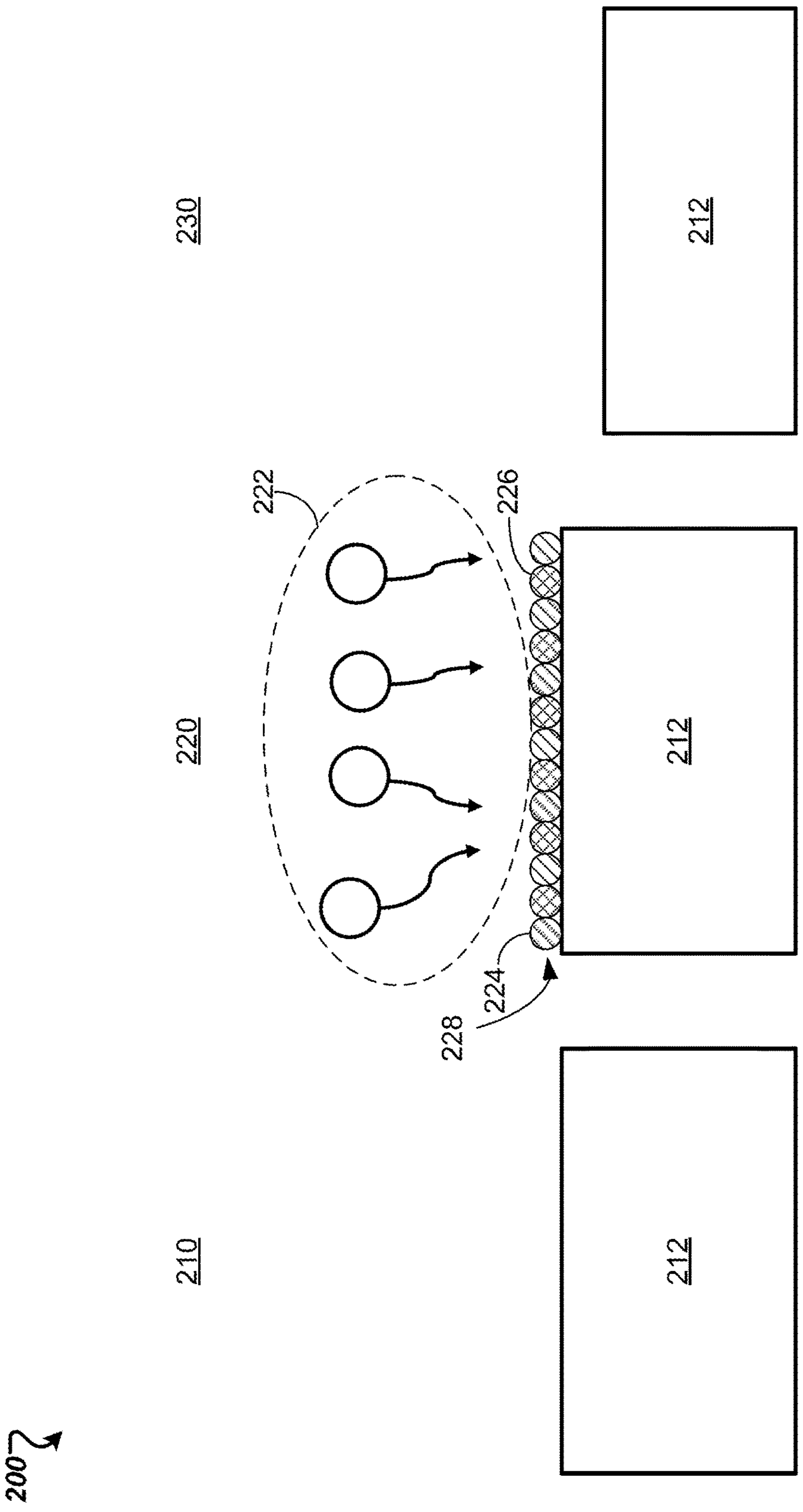
FIG. 2 is a diagram of an example method of isotropic etching a substrate using dissociative adsorption to mitigate etch byproduct formation, in accordance with some embodiments.

FIG. 2 is a diagram 200 of an example method of etching a substrate using dissociative adsorption, in accordance with some embodiments. Initially, at step 210, substrate 212 is provided. For example, substrate 212 can be similar to substrate 144 of FIG. 1, and can be received by a substrate support assembly, such as substrate support assembly 148 of FIG. 1. In some embodiments, substrate 212 includes a Si substrate. In some embodiments, substrate 212 includes a SiN substrate. In some embodiments, substrate 212 includes one or more layers formed thereon. In some embodiments, substrate 212 includes a Si layer formed thereon.

The method shown in FIG. 2 can include a single-step etch process including step 220. More specifically, at step 220, gas 222 is introduced and molecules of gas 222 including atoms 224 and 226 can adsorb to the surface of substrate 212 to form adsorbed layer 228. In some embodiments, adsorbed layer 228 is formed using physisorption. In some embodiments, gas 222 includes at least one F-containing gas. Examples of F-containing gases include $F_2$, HF, $XeF_2$, $ClF_3$, $BrF_3$, $BrF_5$, $IF_5$, etc. In some embodiments, gas 222 includes HF gas, atom 224 is hydrogen (H) and atom 226 is fluorine (F). During the single-step etch process, adsorbed layer 228 spontaneously etches substrate 212 via dissociative adsorption, as shown at step 230. In some embodiments, the etching performed during step 220 has isotropic directionality. Step 220 can be repeated any number of times to remove a target amount of material from substrate 212. In some embodiments, about 1 nm of material is removed for each cycle. In some embodiments, each cycle is performed between about 50 seconds(s) to about 70 s.

The etching at step 220 can be performed at any suitable temperature. In some embodiments, the temperature is less than or equal to 0° C. (i.e., a sub-zero degree temperature). For example, the etch process can be performed at a temperature of less than about 0° C. As another example, the etch process can be performed at a temperature of less than or equal to about −10° C. As another example, the etch process can be performed at a temperature of less than or equal to about −20° C. As another example, the etch process can be performed at a temperature of less than or equal to about −30° C. As yet another example, the etch process can be performed at a temperature of less than or equal to about −40° C. As yet another example, the etch process can be performed at a temperature of less than or equal to about −50° C. As yet another example, the etch process be performed at a temperature of less than or equal to about −60° C. As yet another example, the etch process can be performed at a temperature of less than or equal to about −70° C. As yet another example, the etch process can be performed at a temperature of less than or equal to about −80° C. As yet another example, the etch process can be performed at a temperature of less than or equal to about −90° C. Further details regarding the single-step etch process shown in FIG. 2 will be described below with reference to FIG. 6A.

Figure 3:
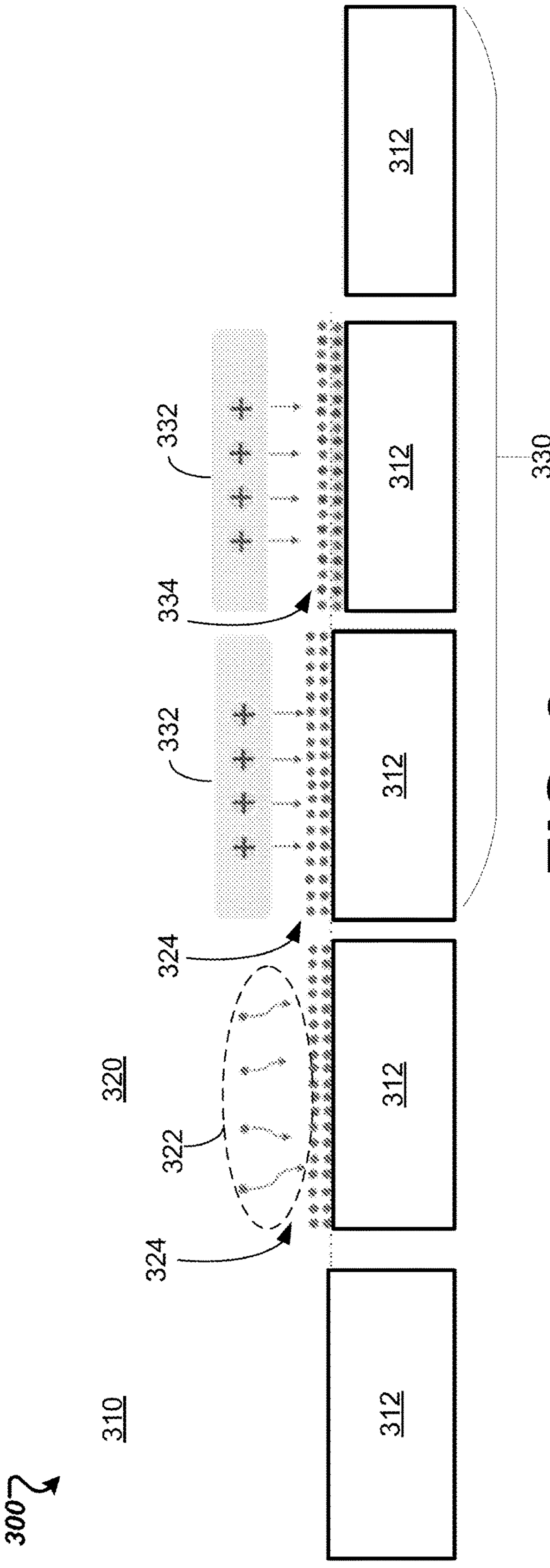
FIG. 3 is a diagram of example method of anisotropic etching a substrate using either ion-impact dissociation of adsorbed species or ion-impact desorption of a non-volatile reaction layer to mitigate etch byproduct formation, in accordance with some embodiments.

FIG. 3 is a diagram 300 an example method of etching a substrate using ion-impact dissociation of molecules adsorbed on a substrate surface, in accordance with some embodiments. Initially, at step 310, substrate 312 is provided. For example, substrate 312 can be similar to substrate 144 of FIG. 1, and can be received by a substrate support assembly, such as substrate support assembly 148 of FIG. 1. In some embodiments, substrate 312 includes a Si substrate.

The method shown in FIG. 3 can include a multi-step etch process including steps 320 and 330. More specifically, at step 320, gas 322 is introduced and molecules of gas 322 can adsorb to the surface of substrate 312 to form adsorbed layer 324. Step 320 can be similar to step 220 of FIG. 2. In some embodiments, adsorbed layer 324 is formed using physisorption. In some embodiments, gas 322 includes at least one F-containing gas. Examples of F-containing gases include $F_2$, HF, $XeF_2$, $ClF_3$, $BrF_3$, $BrF_5$, $IF_5$, etc.

At step 330, ion-impact dissociation is performed with respect to adsorbed layer 324 to release neutrals that are used to etch substrate 312. For example, performing ion-impact dissociation can include bombarding ions toward the surface of substrate 312. Performing ion-impact dissociation can include generating plasma 332 using any suitable gas. In some embodiments, plasma 332 is generated using an inert gas. For example, plasma 332 can be generated using Ar. In some embodiments, plasma 332 is generated using an ion energy greater than or equal to about 25 eV. In some embodiments, the etching performed during step 330 has anisotropic directionality. Step 320 and/or step 330 can be repeated any number of times to remove a target amount of material from substrate 312. In some embodiments, about 1 nm of material is removed for each cycle. In some embodiments, each cycle is performed between about 50 s to about 70 s.

The etching performed at steps 320-330 can be performed at a suitable temperature. In some embodiments, the temperature is less than or equal to 0° C. (i.e., a sub-zero degree temperature). For example, the etch process can be performed at a temperature of less than about 0° C. As another example, the etch process can be performed at a temperature of less than or equal to about −10° C. As another example, the etch process can be performed at a temperature of less than or equal to about −20° C. As another example, the etch process can be performed at a temperature of less than or equal to about −30° C. As yet another example, the etch process can be performed at a temperature of less than or equal to about −40° C. As yet another example, the etch process can be performed at a temperature of less than or equal to about −50° C. As yet another example, the etch process be performed at a temperature of less than or equal to about −60° C. As yet another example, the etch process can be performed at a temperature of less than or equal to about −70° C. As yet another example, the etch process can be performed at a temperature of less than or equal to about −80° C. As yet another example, the etch process can be performed at a temperature of less than or equal to about −90° C. Further details regarding the multi-step etch process shown in FIG. 3 will be described below with reference to FIGS. 5 and 6B.

Figure 4:
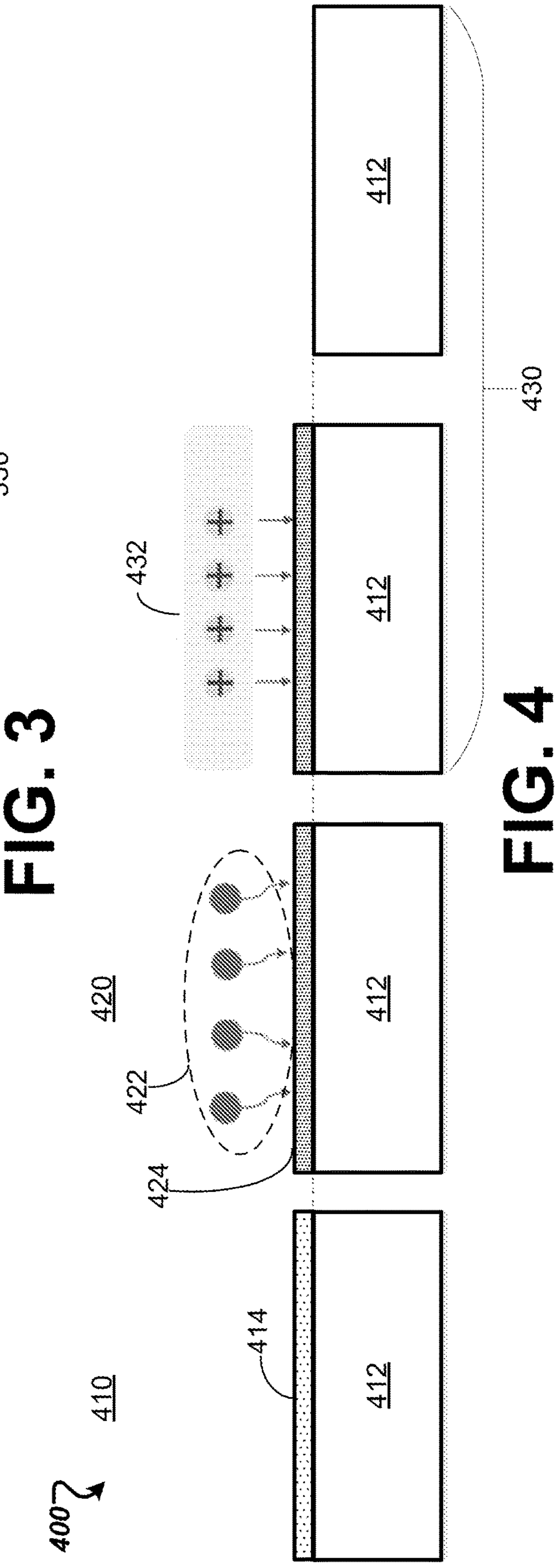
FIG. 4 is a diagram of an example method of etching a native oxide on a substrate surface using ion-impact desorption of a non-volatile reaction layer to mitigate etch byproduct formation, in accordance with some embodiments.

FIG. 4 is a diagram 400 of an example method of etching a substrate using ion-impact desorption of molecules adsorbed on a substrate surface, in accordance with some embodiments. Initially, at step 410, substrate 412 is provided. For example, substrate 412 can be similar to substrate 144 of FIG. 1, and can be received by a substrate support assembly, such as substrate support assembly 148 of FIG. 1. In some embodiments, substrate 412 includes a Si substrate. As further shown, native oxide 414 can be formed on a surface of substrate 412. In some embodiments, native oxide 414 includes $SiO_2$.

The method shown in FIG. 4 can include a multi-step etch process including steps 420 and 430. More specifically, at step 420, gas 422 is introduced and molecules of gas 422 can adsorb to the surface of substrate 412 to form adsorbed layer 424. Adsorbed layer 424 can be a non-volatile reaction layer. Step 420 can be similar to step 220 of FIG. 2. In some embodiments, adsorbed layer 424 is formed using physisorption. In some embodiments, gas 422 includes at least one F-containing gas. Examples of F-containing gases include $F_2$, HF, $XeF_2$, $ClF_3$, $BrF_3$, $BrF_5$, $IF_5$, etc.

At step 430, ion-impact desorption of adsorbed layer 424 is used to etch substrate 412 by removing a portion of substrate 412. For example, performing ion-impact desorption can include bombarding ions toward the surface of substrate 412. Performing ion-impact dissociation can include generating plasma 432 using any suitable gas. In some embodiments, plasma 432 is generated using an inert gas. For example, plasma 432 can be generated using Ar. In some embodiments, plasma 432 is generated using an ion energy greater than or equal to about 25 eV. In some embodiments, the etching performed during step 430 has anisotropic directionality. Step 420 and/or step 430 can be repeated any number of times to remove a target amount of material from substrate 412. In some embodiments, about 1 nm of material is removed for each cycle. In some embodiments, each cycle is performed between about 50 seconds(s) to about 70 s.

The etching performed at steps 420-430 can be performed at a suitable temperature. In some embodiments, the temperature is less than or equal to 0° C. (i.e., a sub-zero degree temperature). For example, the etch process can be performed at a temperature of less than about 0° C. As another example, the etch process can be performed at a temperature of less than or equal to about −10° C. As another example, the etch process can be performed at a temperature of less than or equal to about −20° C. As another example, the etch process can be performed at a temperature of less than or equal to about −30° C. As yet another example, the etch process can be performed at a temperature of less than or equal to about −40° C. As yet another example, the etch process can be performed at a temperature of less than or equal to about −50° C. As yet another example, the etch process be performed at a temperature of less than or equal to about −60° C. As yet another example, the etch process can be performed at a temperature of less than or equal to about −70° C. As yet another example, the etch process can be performed at a temperature of less than or equal to about −80° C. As yet another example, the etch process can be performed at a temperature of less than or equal to about −90° C. Further details regarding the multi-step etch process shown in FIG. 4 will be described below with reference to FIGS. 5 and 6C.

Figure 5:
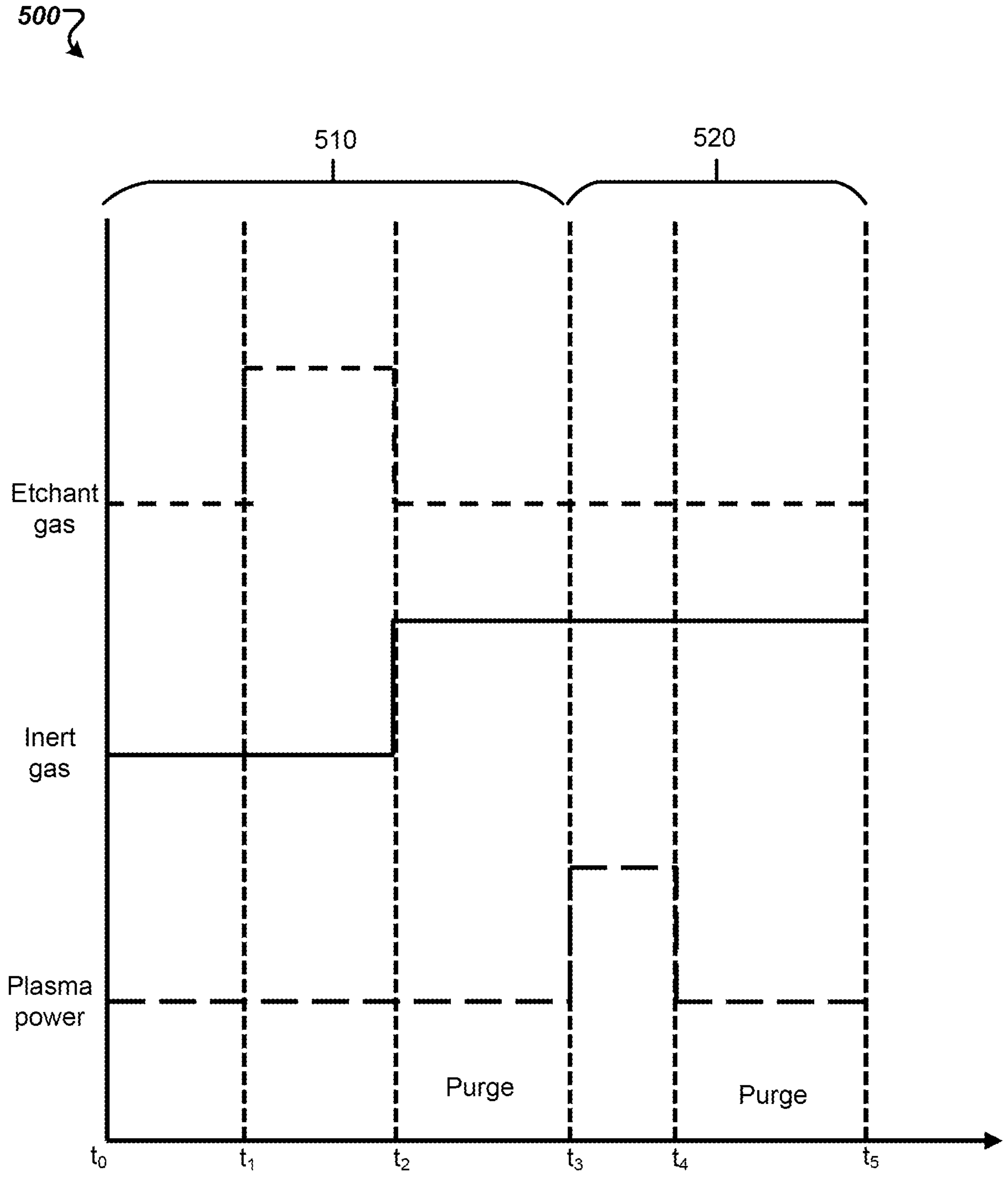
FIG. 5 is a timing diagram of an example method of etching a substrate using vapor adsorption to mitigate etch byproduct formation, in accordance with some embodiments.

FIG. 5 is a timing diagram ("diagram") 500 of an example method of etching a substrate using vapor adsorption, in accordance with some embodiments. More specifically, diagram 500 shows a cycle of a multi-step etch process including step 510 and step 520. For example, step 510 can correspond to steps 310-320 of FIG. 3 or steps 410-420 of FIG. 4, and step 520 can correspond to step 330 of FIG. 3 or step 430 of FIG. 4. It is assumed that the cycle of the multi-step etch process starts at initial time "$t_0$." As shown, from $t_0$ to time "$t_1$," etchant gas flow (e.g., HF flow), inert gas flow (e.g., Ar flow), and plasma power are all off. At $t_1$, the etchant gas flow is turned on to introduce etchant gas within a processing chamber to form, one the substrate, an adsorbed layer including molecules of the etchant gas (e.g., layer 324 of FIG. 3 or layer 424 of FIG. 4). At time "$t_2$," the etchant gas flow is turned off and an inert gas flow is turned on to purge the processing chamber. At time "$t_3$," the plasma power signal is turned on while the inert gas flow stays on to generate plasma used to perform the second step of the etch process (e.g., ion-impact dissociation or ion-impact desorption). At time "$t_4$," the plasma power signal is turned off and the inert gas flow remains on to purge the processing chamber until time "$t_5$." In some embodiments, another cycle of the multi-step etch process can be performed.

Figure 6A:
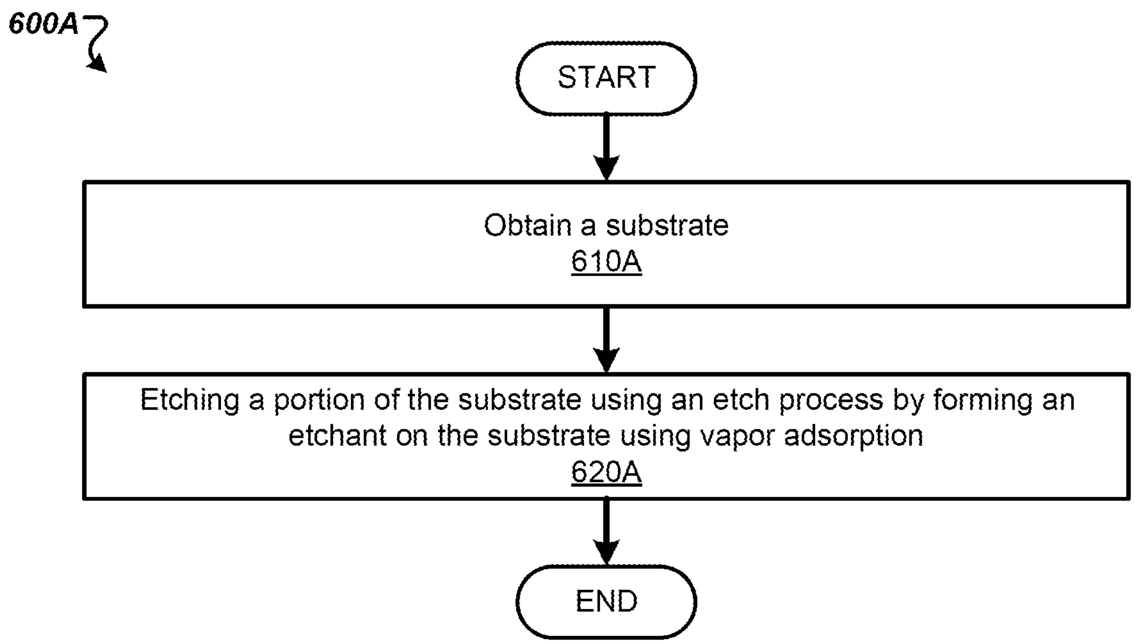
FIGS. 6A-6C are flowcharts of example methods of etching substrates using vapor adsorption to mitigate etch byproduct formation, in accordance with some embodiments.

FIG. 6A is a flowchart of an example method 600A of etching a substrate using vapor adsorption, in accordance with some embodiments. For example, method 600A can be performed with a processing chamber, such as the processing chamber 100 described above with reference to FIG. 1. In some embodiments, method 600A is a method of etching of a substrate using dissociative adsorption, such as the method described above with reference to FIG. 2. In some embodiments, method 600A is a method of etching of a substrate using ion-impact dissociation, such as the method described above with reference to FIGS. 3A-3B and 5 and as will be described in further detail below with reference to FIG. 6B. In some embodiments, method 600A is a method of etching of a native oxide using ion-impact dissociation, such as the method described above with reference to FIGS. 4A-5 and as will be described in further detail below with reference to FIG. 6C.

At block 610A, a substrate is obtained. For example, the substrate can be received by a substrate support assembly of a processing chamber. In some embodiments, the substrate includes a Si substrate.

At block 620A, a portion of the substrate is etched using an etch process by forming an etchant on the substrate using vapor adsorption. More specifically, a gas can be introduced into the processing chamber, and molecules of the gas can adsorb onto a surface of the substrate to form an adsorbed layer. The type of gas used during the etch process to form the etchant can be selected based on the material of the substrate. In some embodiments, the gas includes at least one F-containing gas. Examples of F-containing gases include $F_2$, HF, $XeF_2$, $ClF_3$, $BrF_3$, $BrF_5$, $IF_5$, etc.

In some embodiments, the etch process is a one-step etch process (e.g., one-step etch recipe). In some embodiments, the one-step etch process has isotropic etch directionality. For example, the one-step etch process can be similar to the one-step etch process described above with reference to FIG. 2.

In some embodiments, the etch process is a multi-step etch process (e.g., two-step etch recipe). In some embodiments, the multi-step etch process has anisotropic etch directionality. For example, the multi-step etch process can be similar to the multi-step etch processes described above with reference to FIGS. 3A-5, and as will be described in further detail below with reference to FIGS. 6B-6C.

At a suitable temperature, the molecules of the adsorbed layer can spontaneously etch the substrate in a manner that reduces or eliminates etch byproducts. Etching the portion of the substrate can include bringing the processing chamber to a target temperature. The processing chamber can be brought to the target temperature using one or more cooling elements). For example, a cooling element can include a chiller with a coolant or refrigerant. In some embodiments, the target temperature less than or equal to about 0° C. (i.e., sub-zero degree temperature). For example, the target temperature can be less than about 0° C. As another example, the target temperature can be less than or equal to about −10° C. As another example, the target temperature can be less than or equal to about −20° C. As another example, the target temperature can be less than or equal to about −30° C. As yet another example, the target temperature can be less than or equal to about −40° C. As yet another example, the target temperature can be less than or equal to about −50° C. As yet another example, the target temperature can be less than or equal to about −60° C. As yet another example, the target temperature can be less than or equal to about −70° C. As yet another example, the target temperature can be less than or equal to about −80° C. As yet another example, the target temperature can be less than or equal to about −90° C.

Etching the portion of the substrate can include bringing the processing chamber to a target pressure (e.g., using a pump). In some embodiments, the target pressure ranges from about 0.1 milliTorr to about 500 milliTorr, from about 1 milliTorr to about 400 milliTorr, from about 5 milliTorr to about 300 milliTorr, from about 10 milliTorr to about 200 milliTorr, from about 25 milliTorr to about 100 milliTorr, or any sub range or value herein.

The total gas feed flow of the gas provided for vapor adsorption can be any suitable total gas feed flow in accordance with embodiments described herein. In some embodiments, the total gas feed flow of the gas mixture ranges from about 50 standard cubic centimeters per minute (sccm) to about 2000 sccm, from about 100 sccm to about 1500 sccm, from about 150 sccm to about 1250 sccm, from about 200 sccm to about 1000 sccm, from about 250 sccm to about 750 sccm, or any sub range or value herein.

The total time of introducing the gas into the processing chamber can be any suitable amount of time. In some embodiments, the amount of time ranges from about 1 second(s) to about 500 s, from about 30 s to about 300 s, from about 60 s to about 240 s, from about 120 s to about 200 s, or any sub range or value herein.

Etching a portion of the substrate can include determining whether a target amount of material has been removed from the substrate. If the target amount of material has not been removed from the substrate, then another etch cycle or pulse can be performed. If the target amount of material has been removed from the substrate, then the etch process is complete. For example, determining whether the target amount of material has been removed from the substrate can include checking, after each etch cycle, whether the target amount of material has been removed from the substrate. Additionally, or alternatively, determining whether the target amount of material has been removed from the substrate can include determining whether an amount of time that the etch process has been executed satisfies a threshold condition in accordance with an etch recipe (e.g., is greater than or equal to a target amount of time defined by the etch recipe). If the amount of time does not satisfy the threshold condition (e.g., the etch process has not been performed for the target amount of time), then the target amount of material may not yet have been removed from the substrate. If the amount of time satisfies the threshold condition (e.g., the etch process has been performed for the target amount of time), then this means that the target amount of material is likely to have been removed from the substrate.

In some embodiments, the substrate can have dimensions (e.g., thickness and width) to enable the formation of high aspect ratio features. A feature can have any suitable aspect ratio in accordance with embodiments described herein. In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nanometers (nm) and the width of the feature can be about 16 nm (e.g., an aspect ratio of about 62.5:1). The features formed from the substrate can include any suitable width in accordance with embodiments described herein. In some embodiments, the width of a feature can be less than or equal to about 50 nm. In some embodiments, the width of a feature can be less than or equal to about 40 nm. In some embodiments, the width of a feature can be less than or equal to about 30 nm. In some embodiments, the width of a feature can be less than or equal to about 20 nm.

Figure 6B:
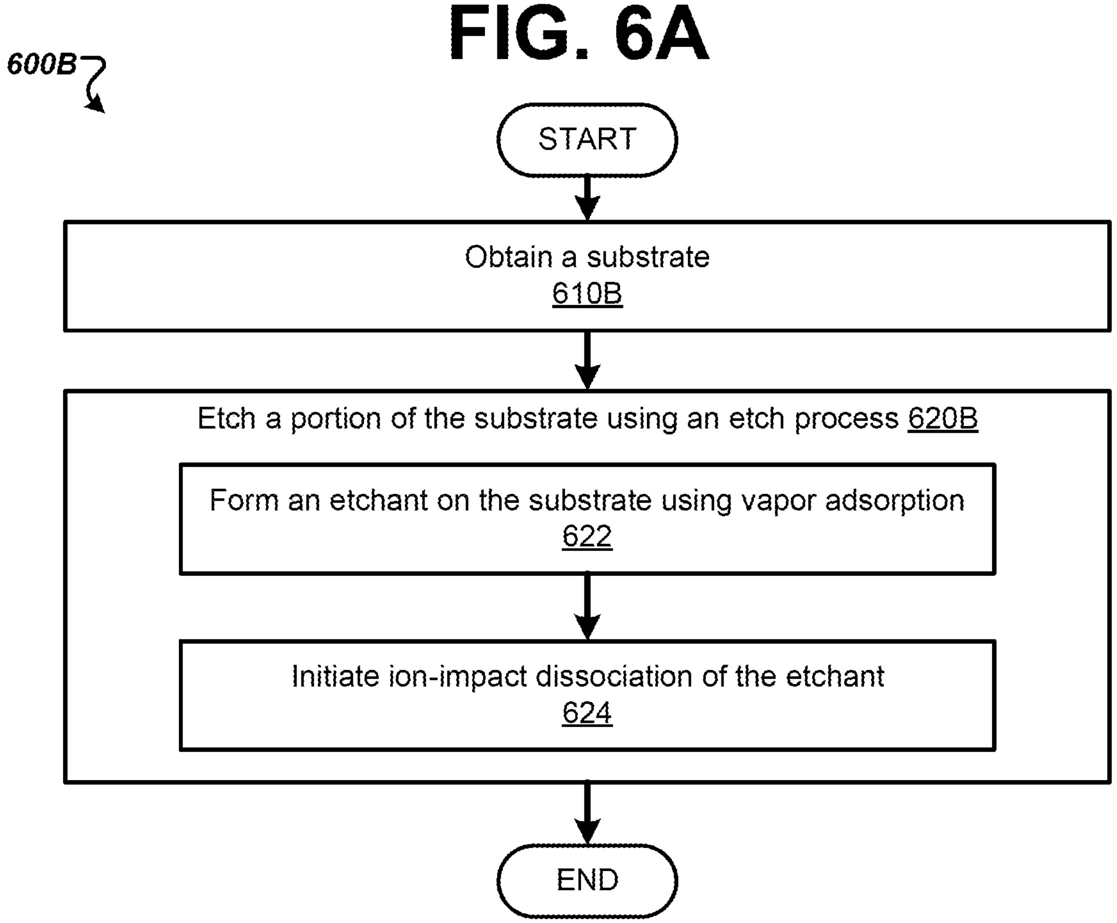

FIG. 6B is a flowchart of an example method 600B of etching of a substrate using ion-impact dissociation of molecules adsorbed on a substrate surface, in accordance with some embodiments. For example, method 600B can be performed with a processing chamber, such as the processing chamber 100 described above with reference to FIG. 1. In some embodiments, method 600B is a method of etching of a substrate using ion-impact dissociation, such as the method described above with reference to FIGS. 3 and 5.

At block 610B, a substrate is obtained. For example, the substrate can be received by a substrate support assembly of a processing chamber. In some embodiments, the substrate is a Si substrate.

At block 620B, a portion of the substrate is etched. In some embodiments, the etch process is a multi-step etch process (e.g., multi-step etch recipe). In some embodiments, the etch process has anisotropic etch directionality. For example, etching the portion of the substrate using an etch process can include, at block 622, forming an etchant on the substrate using vapor adsorption. Block 622 can be similar to block 620A of FIG. 6A.

The total gas feed flow of the gas provided for vapor adsorption can be any suitable total gas feed flow in accordance with embodiments described herein. In some embodiments, the total gas feed flow of the gas mixture ranges from about 50 standard cubic centimeters per minute (sccm) to about 2000 sccm, from about 100 sccm to about 1500 sccm, from about 150 sccm to about 1250 sccm, from about 200 sccm to about 1000 sccm, from about 250 sccm to about 750 sccm, or any sub range or value herein.

Etching the portion of the substrate using the etch process can further include, at block 624, initiating ion-impact dissociation of the etchant. The ion-impact dissociation can release neutrals that can be used to etch material of the substrate. Ion-impact dissociation can be performed at a target temperature. In some embodiments, the target temperature less than or equal to about 0° C. (i.e., sub-zero degree temperature). For example, the target temperature can be less than about 0° C. As another example, the target temperature can be less than or equal to about −10° C. As another example, the target temperature can be less than or equal to about −20° C. As another example, the target temperature can be less than or equal to about −30° C. As yet another example, the target temperature can be less than or equal to about −40° C. As yet another example, the target temperature can be less than or equal to about −50° C. As yet another example, the target temperature can be less than or equal to about −60° C. As yet another example, the target temperature can be less than or equal to about −70° C. As yet another example, the target temperature can be less than or equal to about −80° C. As yet another example, the target temperature can be less than or equal to about −90° C. Ion-impact dissociation can be performed at a target pressure. In some embodiments, the target pressure ranges from about 0.1 milliTorr to about 500 milliTorr, from about 1 milliTorr to about 400 milliTorr, from about 5 milliTorr to about 300 milliTorr, from about 10 milliTorr to about 200 milliTorr, from about 25 milliTorr to about 100 milliTorr, or from about 1 milliTorr to about 100 milliTorr, or any sub range or value herein.

Initiating ion-impact dissociation at block 624 can include applying a bias power to achieve a bias state. Any suitable bias power can be applied in accordance with embodiments described herein. In some embodiments, the bias power is from about 10 watts (W) to about 5,000 W, from about 200 W to about 2,000 W, from about 300 W to about 3,000 W, from about 400 W to about 2,500 W, from about 500 W to about 2,000 W, from about 600 W to about 1,500 W, or from about 750 W to about 1,250 W, or any sub range or value herein. A higher bias power can result in a straighter profile (e.g., more vertical profile on the trench sidewalls) with reduced profile bowing and lower selectivity to a pattern mask. The bias power may be a time-average power. The bias frequency can be any suitable frequency in accordance with embodiments described herein. In some embodiments, the bias frequency is from about 400 kilohertz (kHZ) to about 60 megahertz (MHz), from about 400 kHz to about 40 MHz, from about 400 kHz to about 35 MHz, from about 400 kHz to about 27 MHz, from about 400 kHz to about 20 MHz, or from about 800 kHz to about 10 MHz, or any sub range or value herein. The bias power can be applied for any suitable time in accordance with embodiments described herein. In some embodiments, the bias power is applied from about 10 microseconds (μs) to about 1 ms, from about 30 us to about 1 ms, from about 50 us to about 1 ms, from about 70 us to about 1 ms, or from about 85 us to about 1 ms, or any sub range or value herein.

Initiating ion-impact dissociation at block 624 can include further include applying a source power after the bias power to achieve a source state. Any suitable source power can be applied in accordance with embodiments described herein. In some embodiments, the source power is from about 10 W to about 5000 W, from about 200 W to about 2,000 W, from about 300 W to about 3,000 W, from about 400 W to about 2,500 W, from about 500 W to about 2,000 W, from about 600 W to about 1,500 W, or from about 750 W to about 1,250 W, or any sub range or value herein. The source power may be a time-average source power (e.g., source power times duty cycle). The source frequency can be any suitable frequency in accordance with embodiments described herein. In some embodiments, the source frequency is about 10 MHz to about 15 MHz, or about 13 MHz, or any sub range or value herein. The source power can be applied for any suitable time in accordance with embodiments described herein. In some embodiments, the source power can be applied from about 10 us to about 1 ms, from about 30 us to about 1 ms, from about 50 us to about 1 ms, from about 70 us to about 1 ms, or from about 85 us to about 1 ms, or any sub range or value herein.

In some embodiments, a ratio of the first time period to the second time period is from about 1:10 to about 10:1, from about 1:9 to about 9:1, from about 1:8 to about 8:1, from about 1:7 to about 7:1, from about 1:6 to about 6:1, from about 1:5 to about 5:1, from about 1:4 to about 4:1, from about 1:3 to about 3:1, from about 1:2 to about 2:1, or about 1:1, or any sub range or value herein.

Etching a portion of the substrate can include determining whether a target amount of material has been removed from the substrate. If the target amount of material has not been removed from the substrate, then another etch cycle or pulse can be performed. If the target amount of material has been removed from the substrate, then the etch process is complete. For example, determining whether the target amount of material has been removed from the substrate can include checking, after each etch cycle or pulse, whether the target amount of material has been removed from the substrate. Additionally or alternatively, determining whether the target amount of material has been removed from the substrate can include determining whether an amount of time that the etch process has been executed satisfies a threshold condition in accordance with an etch recipe (e.g., is greater than or equal to a target amount of time defined by the etch recipe). If the amount of time does not satisfy the threshold condition (e.g., the etch process has not been performed for the target amount of time), then the target amount of material may not yet have been removed from the substrate. If the amount of time satisfies the threshold condition (e.g., the etch process has been performed for the target amount of time), then this means that the target amount of material is likely to have been removed from the substrate.

In some embodiments, the substrate can have dimensions (e.g., thickness and width) to enable the formation of high aspect ratio features. A feature can have any suitable aspect ratio in accordance with embodiments described herein. In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nanometers (nm) and the width of the feature can be about 16 nm (e.g., an aspect ratio of about 62.5:1). The features formed from the substrate can include any suitable width in accordance with embodiments described herein. In some embodiments, the width of a feature can be less than or equal to about 50 nm. In some embodiments, the width of a feature can be less than or equal to about 40 nm. In some embodiments, the width of a feature can be less than or equal to about 30 nm. In some embodiments, the width of a feature can be less than or equal to about 20 nm.

Figure 6C:
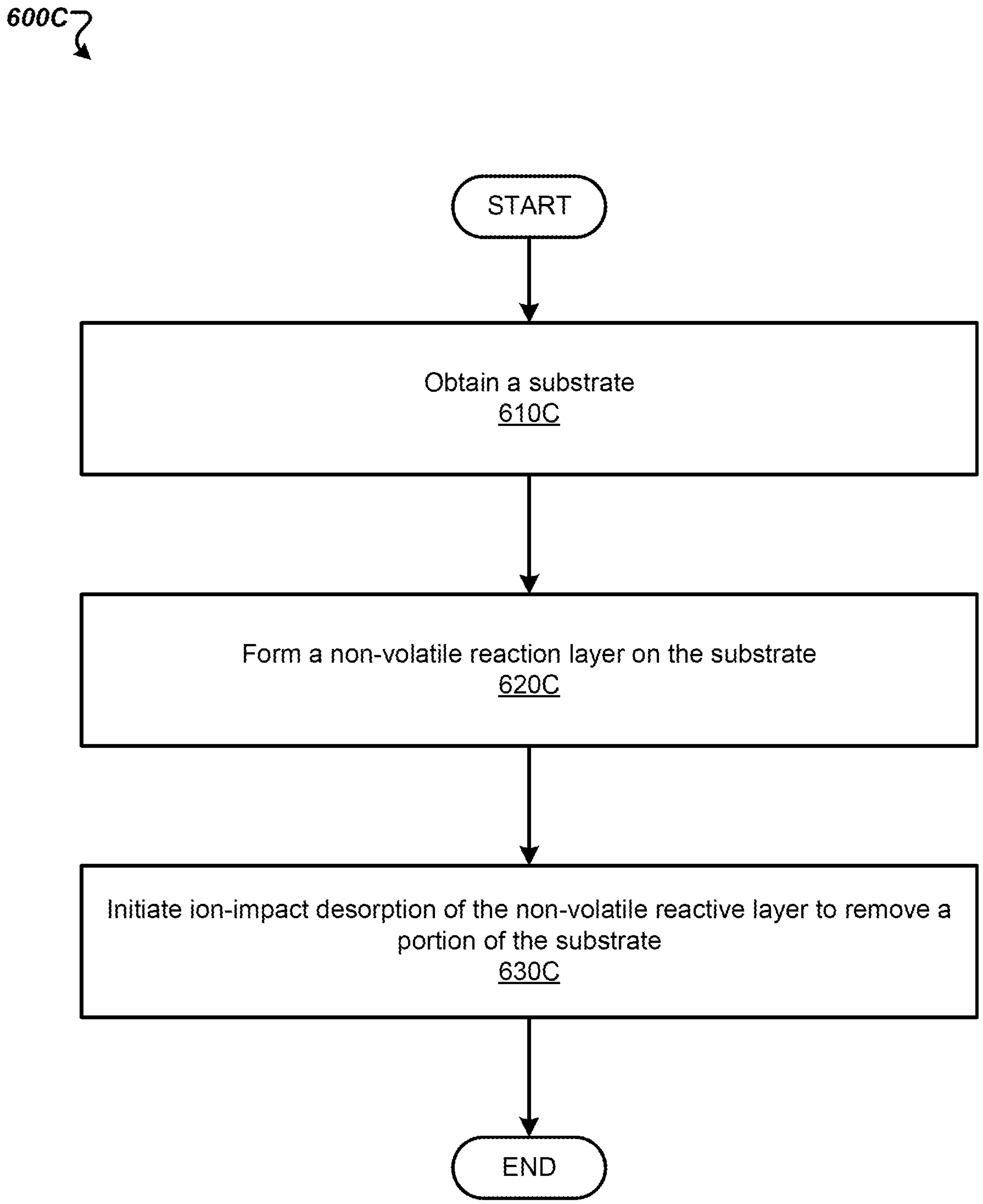

FIG. 6C is a flowchart of an example method 600C of etching of a substrate using ion-impact desorption of molecules adsorbed on a substrate surface, in accordance with some embodiments. For example, method 600C can be performed with a processing chamber, such as the processing chamber 100 described above with reference to FIG. 1. In some embodiments, method 600C is a method of etching of a substrate using ion-impact desorption, such as the method described above with reference to FIGS. 4-5. In some embodiments, the etch process is a multi-step etch process (e.g., multi-step etch recipe). In some embodiments, the etch process has anisotropic etch directionality.

At block 610C, a substrate is obtained. For example, the substrate can be received by a substrate support assembly of a processing chamber. In some embodiments, the substrate is a Si substrate.

At block 620C, a non-volatile reactive layer is formed on the substrate. For example, a native oxide can be formed on a surface of the substrate, and forming the non-volatile reactive layer can include introducing a gas to form an etchant on the using vapor adsorption. In some embodiments, the native oxide includes $SiO_2$. In some embodiments, the gas includes at least one F-containing gas. Examples of F-containing gases include $F_2$, HF, $XeF_2$, $ClF_3$, $BrF_3$, $BrF_5$, $IF_5$, etc.

The total gas feed flow of the gas provided for vapor adsorption can be any suitable total gas feed flow in accordance with embodiments described herein. In some embodiments, the total gas feed flow of the gas mixture ranges from about 50 sccm to about 2000 sccm, from about 100 sccm to about 1500 sccm, from about 150 sccm to about 1250 sccm, from about 200 sccm to about 1000 sccm, from about 250 sccm to about 750 sccm, or any sub range or value herein.

At block 630C, ion-impact desorption of the non-volatile reactive layer to remove a portion of the substrate is initiated. Ion-impact desorption can be performed at a target temperature. In some embodiments, the target temperature less than or equal to about 0° C. (i.e., sub-zero degree temperature). For example, the target temperature can be less than about 0° C. As another example, the target temperature can be less than or equal to about −10° C. As another example, the target temperature can be less than or equal to about −20° C. As another example, the target temperature can be less than or equal to about −30° C. As yet another example, the target temperature can be less than or equal to about −40° C. As yet another example, the target temperature can be less than or equal to about −50° C. As yet another example, the target temperature can be less than or equal to about −60° C. As yet another example, the target temperature can be less than or equal to about −70° C. As yet another example, the target temperature can be less than or equal to about −80° C. As yet another example, the target temperature can be less than or equal to about −90° C.

Ion-impact desorption can be performed at a target pressure. In some embodiments, the target pressure ranges from about 0.1 milliTorr to about 500 milliTorr, from about 1 milliTorr to about 400 milliTorr, from about 5 milliTorr to about 300 milliTorr, from about 10 milliTorr to about 200 milliTorr, from about 25 milliTorr to about 100 milliTorr, or from about 1 milliTorr to about 100 milliTorr, or any sub range or value herein.

Initiating ion-impact desorption at block 630C can include applying a bias power to achieve a bias state. Any suitable bias power can be applied in accordance with embodiments described herein. In some embodiments, the bias power is from about 10 watts (W) to about 5,000 W, from about 200 W to about 2,000 W, from about 300 W to about 3,000 W, from about 400 W to about 2,500 W, from about 500 W to about 2,000 W, from about 600 W to about 1,500 W, or from about 750 W to about 1,250 W, or any sub range or value herein. A higher bias power can result in a straighter profile (e.g., more vertical profile on the trench sidewalls) with reduced profile bowing and lower selectivity to a pattern mask. The bias power may be a time-average power. The bias frequency can be any suitable frequency in accordance with embodiments described herein. In some embodiments, the bias frequency is from about 400 kilohertz (kHZ) to about 60 megahertz (MHz), from about 400 kHz to about 40 MHz, from about 400 kHz to about 35 MHz, from about 400 kHz to about 27 MHz, from about 400 kHz to about 20 MHz, or from about 800 kHz to about 10 MHz, or any sub range or value herein. The bias power can be applied for any suitable time in accordance with embodiments described herein. In some embodiments, the bias power is applied from about 10 us to about 1 ms, from about 30 us to about 1 ms, from about 50 us to about 1 ms, from about 70 us to about 1 ms, or from about 85 us to about 1 ms, or any sub range or value herein.

Initiating ion-impact desorption at block 630C can include further include applying a source power after the bias power to achieve a source state. Any suitable source power can be applied in accordance with embodiments described herein. In some embodiments, the source power is from about 10 W to about 5000 W, from about 200 W to about 2,000 W, from about 300 W to about 3,000 W, from about 400 W to about 2,500 W, from about 500 W to about 2,000 W, from about 600 W to about 1,500 W, or from about 750 W to about 1,250 W, or any sub range or value herein. The source power may be a time-average source power (e.g., source power times duty cycle). The source frequency can be any suitable frequency in accordance with embodiments described herein. In some embodiments, the source frequency is about 10 MHz to about 15 MHz, or about 13 MHz, or any sub range or value herein. The source power can be applied for any suitable time in accordance with embodiments described herein. In some embodiments, the source power can be applied from about 10 us to about 1 ms, from about 30 us to about 1 ms, from about 50 us to about 1 ms, from about 70 us to about 1 ms, or from about 85 us to about 1 ms, or any sub range or value herein.

In some embodiments, a ratio of the first time period to the second time period is from about 1:10 to about 10:1, from about 1:9 to about 9:1, from about 1:8 to about 8:1, from about 1:7 to about 7:1, from about 1:6 to about 6:1, from about 1:5 to about 5:1, from about 1:4 to about 4:1, from about 1:3 to about 3:1, from about 1:2 to about 2:1, or about 1:1, or any sub range or value herein.

Etching a portion of the substrate can include determining whether a target amount of material has been removed from the substrate. If the target amount of material has not been removed from the substrate, then another etch cycle or pulse can be performed. If the target amount of material has been removed from the substrate, then the etch process is complete. For example, determining whether the target amount of material has been removed from the substrate can include checking, after each etch cycle or pulse, whether the target amount of material has been removed from the substrate. Additionally or alternatively, determining whether the target amount of material has been removed from the substrate can include determining whether an amount of time that the etch process has been executed satisfies a threshold condition in accordance with an etch recipe (e.g., is greater than or equal to a target amount of time defined by the etch recipe). If the amount of time does not satisfy the threshold condition (e.g., the etch process has not been performed for the target amount of time), then the target amount of material may not yet have been removed from the substrate. If the amount of time satisfies the threshold condition (e.g., the etch process has been performed for the target amount of time), then this means that the target amount of material is likely to have been removed from the substrate.

In some embodiments, the substrate can have dimensions (e.g., thickness and width) to enable the formation of high aspect ratio features. A feature can have any suitable aspect ratio in accordance with embodiments described herein. In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nanometers (nm) and the width of the feature can be about 16 nm (e.g., an aspect ratio of about 62.5:1). The features formed from the substrate can include any suitable width in accordance with embodiments described herein. In some embodiments, the width of a feature can be less than or equal to about 50 nm. In some embodiments, the width of a feature can be less than or equal to about 40 nm. In some embodiments, the width of a feature can be less than or equal to about 30 nm. In some embodiments, the width of a feature can be less than or equal to about 20 nm.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
obtaining a substrate;
forming an etchant on the substrate using vapor adsorption of an etchant gas, wherein the etchant gas comprises molecules of a fluorine (F)-containing gas that is selected to mitigate byproduct formation; and
etching a portion of the substrate using a single-step etch process, performed at a temperature of less than or equal to about zero degrees Celsius, in which the etchant spontaneously etches material of the substrate at the temperature.

2. The method of claim 1, wherein the substrate comprises a silicon (Si) substrate.

3. The method of claim 1, wherein the fluorine (F)-containing gas is selected from the group consisting of: fluorine gas ($F_2$), hydrogen fluoride (HF), xenon difluoride ($XeF_2$), chlorine trifluoride ($ClF_3$), bromine trifluoride ($BrF_3$), bromine pentafluoride ($BrF_5$), and iodine pentafluoride ($IF_5$).

4. The method of claim 1, wherein the etchant is formed using physisorption.

5. The method of claim 1, wherein the etch process is an inductively coupled plasma (ICP)-based etch process.

6. The method of claim 1, wherein the fluorine (F)-containing gas is selected from the group consisting of: fluorine gas ($F_2$), hydrogen fluoride (HF), xenon difluoride ($XeF_2$), chlorine trifluoride ($ClF_3$), bromine trifluoride ($BrF_3$), bromine pentafluoride ($BrF_5$), and iodine pentafluoride ($IF_5$).

7. The method of claim 1, wherein the single-step etch process has isotropic etch directionality.

8. A method comprising:
forming, on a substrate at a temperature of less than or equal to about zero degrees Celsius via physisorption of molecules of an etchant gas, a non-volatile reactive layer based on a native oxide formed on the substrate; and
initiating ion-impact desorption of the non-volatile reactive layer to remove a portion of the substrate, wherein the etchant gas comprises molecules of a fluorine (F)-containing gas that is selected, from the group consisting of: fluorine gas ($F_2$), hydrogen fluoride (HF), xenon difluoride ($XeF_2$), chlorine trifluoride ($ClF_3$), bromine trifluoride ($BrF_3$), bromine pentafluoride ($BrF_5$), and iodine pentafluoride ($IF_5$), to mitigate byproduct formation.

9. The method of claim 8, wherein the substrate comprises a silicon (Si) substrate.

10. The method of claim 8, wherein initiating the ion-impact desorption further comprises generating a plasma using an inert gas.

11. The method of claim 10, wherein the inert gas comprises argon.

12. The method of claim 8, wherein the ion-impact desorption has anisotropic etch directionality.

13. A method comprising:
obtaining a substrate; and
etching a portion of the substrate using a multi-step etch process performed at a temperature of less than or equal to about zero degrees Celsius, wherein etching the portion of the substrate using the multi-step etch process comprises:
forming an etchant on the substrate using vapor adsorption of an etchant gas, the etchant gas comprising molecules of a fluorine (F)-containing gas that is selected, from the group consisting of: fluorine gas ($F_2$), hydrogen fluoride (HF), xenon difluoride ($XeF_2$), chlorine trifluoride ($ClF_3$), bromine trifluoride ($BrF_3$), bromine pentafluoride ($BrF_5$), and iodine pentafluoride ($IF_5$), to mitigate byproduct formation; and
initiating ion-impact desorption of a non-volatile reactive layer formed on the substrate to remove the portion of the substrate.

14. The method of claim 13, wherein the substrate comprises a silicon (Si) substrate.

15. The method of claim 13, wherein etching the portion of the substrate using the multi-step etch process further comprises forming the non-volatile reactive layer on the substrate based on the etchant and a native oxide formed on the substrate.

16. The method of claim 13, wherein initiating the ion-impact desorption further comprises generating a plasma using an inert gas.

17. The method of claim 16, wherein the inert gas comprises argon.

18. The method of claim 13, wherein the etch process is an inductively coupled plasma (ICP)-based etch process.

19. The method of claim 13, wherein the etchant is formed using physisorption.

20. The method of claim 13, wherein the multi-step etch process has anisotropic etch directionality.

* * * * *